(12) United States Patent
Ramaswamy et al.

(10) Patent No.: US 12,293,897 B2
(45) Date of Patent: May 6, 2025

(54) RADIO FREQUENCY DIVERTER ASSEMBLY ENABLING ON-DEMAND DIFFERENT SPATIAL

(71) Applicant: Applied Materials, Inc., Santa Clara, CA (US)

(72) Inventors: Kartik Ramaswamy, San Jose, CA (US); Yue Guo, Redwood City, CA (US); A N M Wasekul Azad, Santa Clara, CA (US); Yang Yang, San Diego, CA (US); Nicolas J. Bright, Arlington, WA (US)

(73) Assignee: Applied Materials, Inc., Santa Clara, CA (US)

( * ) Notice: Subject to any disclaimer, the term of this patent is extended or adjusted under 35 U.S.C. 154(b) by 255 days.

(21) Appl. No.: 18/115,537

(22) Filed: Feb. 28, 2023

(65) Prior Publication Data

US 2024/0290578 A1 Aug. 29, 2024

(51) Int. Cl.
*H01J 37/32* (2006.01)

(52) U.S. Cl.
CPC .. *H01J 37/32183* (2013.01); *H01J 37/32091* (2013.01); *H01J 37/321* (2013.01)

(58) Field of Classification Search
CPC ........... H01J 37/32183; H01J 37/32091; H01J 37/321
See application file for complete search history.

(56) References Cited

U.S. PATENT DOCUMENTS

| 5,392,009 A * | 2/1995 | Talwar | H03C 1/14 |
| | | | 333/81 R |
| 2009/0284156 A1* | 11/2009 | Banna | H01J 37/32155 |
| | | | 315/111.21 |

(Continued)

FOREIGN PATENT DOCUMENTS

| EP | 1744345 A1 | 1/2007 |
| KR | 20200056200 A | 5/2020 |
| WO | 2022108754 A1 | 5/2022 |

OTHER PUBLICATIONS

International Search Report/Written Opinion issued to PCT/US2024/012371 on May 21, 2024.

*Primary Examiner* — Minh D A
(74) *Attorney, Agent, or Firm* — Patterson + Sheridan, LLP

(57) ABSTRACT

A method and apparatus for spatially switching radio frequency (RF) power from a single RF power generator to a selected one of two or more impedance matching networks coupled to associated RF electrodes for forming plasma in a plasma chamber. Full RF power may be switched within microseconds to the selected one of the two or more impedance matching networks. The two or more impedance matching networks may be coupled to one or more plasma generating electrodes. The two or more impedance matching networks may be interleaved during plasma processing recipe operation. Impedance matching networks can alternate back and forth during operation of a plasma processing recipe. This interleaving in operation and impedance trans- (Continued)

formation capabilities may also be performed with more than two impedance matching networks, and may be beneficial in enabling the use of fixed tuned impedance matching networks instead of requiring variable impedance matching networks having variable tuning capabilities.

19 Claims, 9 Drawing Sheets

(56) References Cited

U.S. PATENT DOCUMENTS

| | | | |
|---|---|---|---|
| 2014/0177970 A1* | 6/2014 | Mese | G06F 16/583 382/220 |
| 2017/0372873 A1 | 12/2017 | Yamada et al. | |
| 2022/0005674 A1 | 1/2022 | Radomski et al. | |
| 2022/0130642 A1* | 4/2022 | Kawasaki | H01J 37/244 |
| 2022/0158604 A1 | 5/2022 | Kapoor et al. | |

\* cited by examiner

RADIO FREQUENCY DIVERTER ASSEMBLY ENABLING ON-DEMAND DIFFERENT SPATIAL

BACKGROUND

Field

Embodiments of the present disclosure generally relate to apparatus and methods to control the radio frequency (RF) power output from an RF generator to plasma processing electrodes in a plasma processing chamber.

Description of the Related Art

Reliably producing high aspect ratio features is one of the key technology challenges for the next generation of semiconductor devices. One method of forming high aspect ratio features uses a plasma-assisted etching process to bombard a material formed on a surface of a substrate through openings formed in a patterned mask layer formed on the substrate surface.

With technology nodes advancing towards two nanometers (nm), the fabrication of smaller features with larger aspect ratios requires atomic precision for plasma processing. For etching processes where the plasma ions play a major role, ion energy control is always challenging the development of reliable and repeatable device formation processes in the semiconductor equipment industry. In a typical plasma-assisted etching process, the substrate is positioned on a substrate support disposed in a processing chamber, a plasma is formed over the substrate by use of a radio frequency (RF) generator that is coupled to an electrode disposed on or within the plasma processing chamber, and ions are accelerated from the plasma towards the substrate across a plasma sheath. Additionally, RF substrate biasing methods, which require the use of a separate RF biasing source in addition to the RF generator that is used to initiate and maintain the plasma in the processing chamber, have been unable to desirably control the plasma sheath properties to achieve desirable plasma processing results that will allow the formation of these smaller device feature sizes.

However, non-uniformities in the plasma density and/or in the shape of the plasma sheath can occur, due to the variations in the electrical characteristics of and/or spatial arrangement of the processing components disposed within a processing region of a plasma processing chamber. One common plasma density variation is created within conventional inductively coupled plasma (ICP) sources that include a coil that is positioned over the processing region of a plasma chamber due to the coil being axisymmetric and thus having a magnetic field null point positioned at a central axis of the coil. The variation in plasma will cause undesirable processing results in etched features formed across the surface of the substrate. Excessive variation in plasma non-uniformity will adversely affect the process results and reduce device yield. Such non-uniformities are often particularly pronounced near or between the center and edge of the substrate.

In a conventional capacitively coupled plasma (CCP) processing chamber a radio frequency (RF) power source provides RF power to an electrode in the processing chamber for generating plasma therein, via an impedance matching network coupled between the RF power source and the electrode. However, the conventional multi-electrode approach requires separate RF generators (RF power sources) and associated impedance matching networks to provide RF power to the separate RF electrodes. The current state of the art CCP processing chambers are thus complex, hard to control and costly.

During a plasma processing recipe, electrode RF load impedances may change rapidly which may require an associated impedance matching network to rapidly adjust (e.g., rematch (tune)) to the new load impedance of the electrode(s). Since the impedance matching network uses motor driven tuning elements, such as vacuum variable capacitors, the matching time may take milliseconds or greater which will interrupt and/or degrade the plasma processing of a substrate. Different fixed impedance matching networks may be used for different electrode impedances during the plasma process but these fixed impedance matching networks, preferably, must be rapidly switched at full RF powers provided from the RF generator. Also, in some plasma processing recipes changing from top to bottom electrodes may be necessary, which will also require fast switching at high RF powers. However, switching at high RF powers between matching networks and/or electrodes can be problematic, due to arcing, as the high voltages and high currents created by the high RF power may be involved.

Hence, there is a need for an apparatus and method for rapidly switching high power RF from an RF generator to two or more impedance matching networks coupled to one or more electrodes without interrupting or degrading the plasma generating energy provided from one or more RF generators.

SUMMARY

Embodiments of the disclosure include a radio frequency (RF) diverter assembly providing on demand different spatial RF outputs, including a first hybrid coupler having four RF ports and a second hybrid coupler having four RF ports. A first RF port of the first hybrid coupler is coupled to a first RF port of the second hybrid coupler. A second RF port of the first hybrid coupler is coupled to a second RF port of the second hybrid coupler. A first controllable impedance circuit having a first node coupled to the first RF ports of the first and second hybrid couplers and a second node coupled to an equipment common. A second controllable impedance circuit having a first node coupled to the second RF ports of the first and second hybrid couplers and a second node coupled to the equipment common. The first and second controllable impedance circuits have a first impedance at a frequency when configured to be parallel resonant at the frequency, and a second impedance when configured to not be parallel resonant at the frequency, wherein the first impedance is greater than the second impedance.

Embodiments of the disclosure include a plasma processing chamber having a substrate support assembly that includes a substrate supporting surface that at least partially defines a processing region of the plasma processing chamber and first and second electrodes in the plasma processing chamber. A radio frequency (RF) power source assembly includes an RF generator, and an RF diverter assembly having an RF input adapted for coupling to the RF generator and first and second RF outputs adapted for coupling to first and second impedance matching networks, respectively. An output of the first impedance matching network is coupled to the first electrode. An output of the second impedance matching network is coupled to the second electrode. The RF diverter assembly includes a first hybrid coupler having four RF ports and a second hybrid coupler having four RF ports. A first RF port of the first hybrid coupler is coupled to a first RF port of the second hybrid coupler. A second RF port of the first hybrid coupler is coupled to a second RF port of the second hybrid coupler. A third RF port of the first hybrid coupler is coupled to the RF input of the RF diverter assembly. A third RF port of the second hybrid coupler is coupled to the first RF output of the RF diverter assembly. A fourth RF port of the first hybrid coupler is coupled to the second RF output of the RF diverter assembly. The third RF port of the first hybrid coupler is coupled to the third RF port of the second hybrid coupler when the first and second controllable impedance circuits are at the first impedance. The third RF port of the first hybrid coupler is coupled to the fourth RF port of the first hybrid coupler when the first and second controllable impedance circuits are at the second impedance. The first electrode is a top electrode above the substrate support assembly, and the second electrode is a bottom electrode integral with the substrate support assembly. The first and second electrodes are top electrodes above the substrate support assembly. The first and second electrodes are both coupled to the first and second impedance matching networks. A plurality of RF diverters having inputs selectively coupled to the RF generator and outputs coupled to respective ones of a plurality of impedance matching networks. The outputs of the plurality of impedance matching networks are coupled to respective ones of a plurality of electrodes in the plasma processing chamber. A system controller controls the first and second controllable impedance circuits to select the first or second impedances thereof.

Embodiments of the disclosure include a plasma processing method for generating a plasma in a processing region defined by an electrode assembly and a substrate support assembly. The electrode assembly includes first and second electrodes. A radio frequency (RF) power source assembly includes an RF generator, an RF diverter assembly having an RF input coupled to an output of the RF generator and first and second RF outputs selectively switchable to the RF input. A first impedance matching network having an input coupled to the first output of the RF diverter assembly. A second impedance matching network having an input coupled to the second output of the RF diverter assembly. The method also includes generating, by the RF generator, an RF waveform. The generated RF waveform establishes a first RF waveform at the first electrode when the RF diverter assembly first output is switched to the RF diverter assembly input or a second RF waveform at the second electrode when the RF diverter assembly second output is switched to the RF diverter assembly input.

Embodiments of the disclosure may also include a radio frequency (RF) diverter assembly, comprising: a first hybrid coupler having four RF ports; a second hybrid coupler having four RF ports; wherein a first port of the first hybrid coupler is coupled to a first port of the second hybrid coupler, and a second RF port of the first hybrid coupler is coupled to a second RF port of the second hybrid coupler; a first impedance producing element coupled between the first RF port of the first hybrid coupler and an equipment common; a second impedance producing element coupled between the first RF port of the first hybrid coupler and a first terminal of a first switchable electrical contact, wherein a second terminal of the first switchable electrical contact is coupled to the equipment common; a third impedance producing element coupled between the second RF port of the first hybrid coupler and the equipment common; and a fourth impedance producing element coupled between the second RF port of the first hybrid coupler and a first terminal of a second switchable electrical contact, wherein a second terminal of the second switchable electrical contact is coupled to the equipment common. The first impedance producing element has a resonant frequency at a first RF frequency. The first impedance producing element may comprise an inductor that is connected in series between the input port of the first switched parallel resonant trap and the equipment common.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
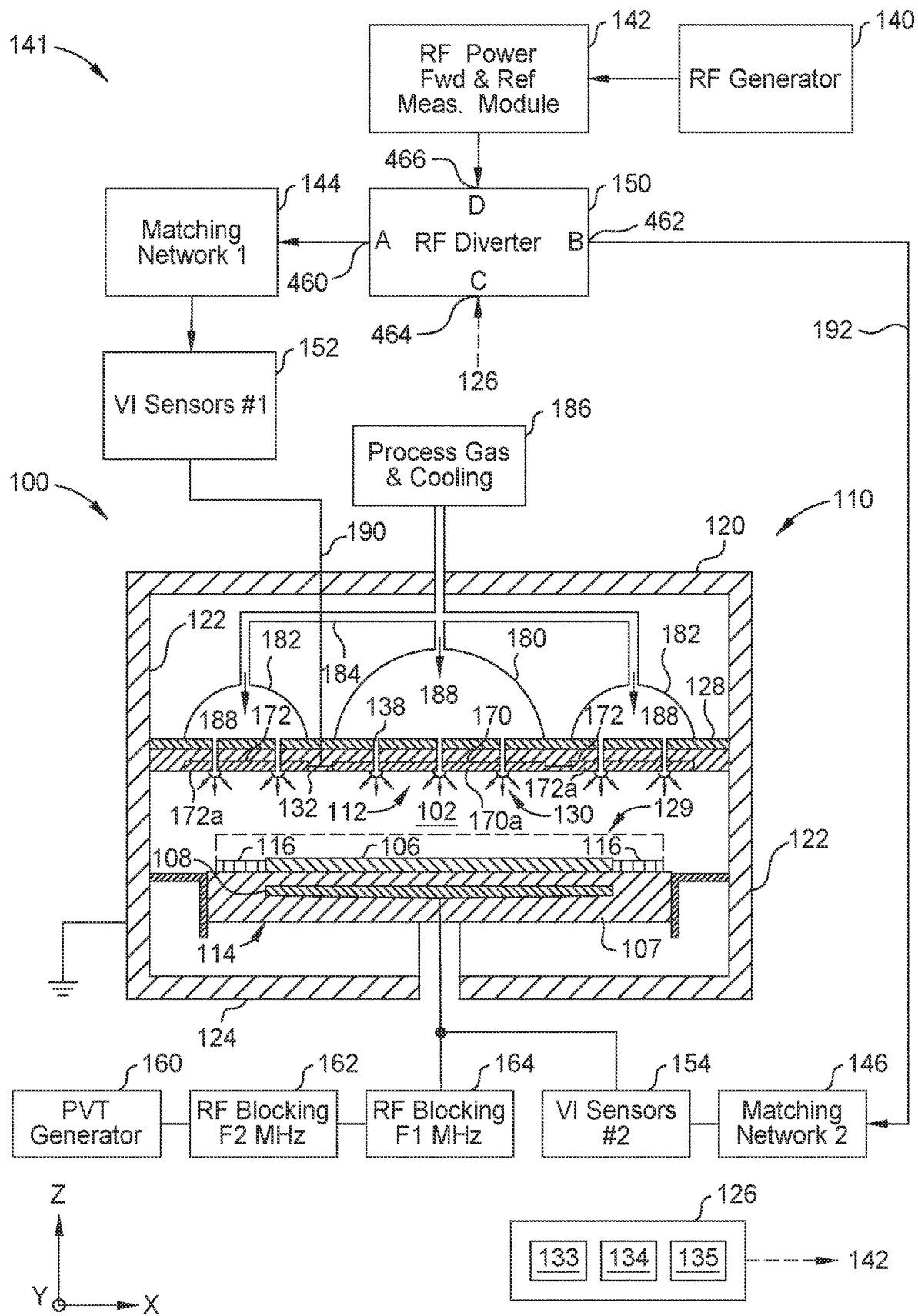
FIGS. 1A and 1B, illustrate schematic side cross-sectional views of plasma processing chambers and block diagrams of supporting electrical circuits of plasma processing systems, according to one or more embodiments of this disclosure.

Embodiments of the present disclosure generally relate to apparatus and methods for switching radio frequency (RF) power from a single RF power generator to a selected one of two or more impedance matching networks coupled to associated RF electrodes for forming a plasma in a plasma processing chamber. Embodiments of the disclosure provided herein can allow the full RF power to be switched between RF electrodes that are each coupled to one of the two or more impedance matching networks within a microsecond timeframe or less. The two or more impedance matching networks may be interleaved in time during plasma recipe operation. Tuning parameters for one impedance matching network can be configured (set) for a first plasma processing chamber operating condition, and the tuning parameters for another impedance matching network can be configured (set) for a second plasma processing chamber operating condition, which are each achieved at different times within a plasma process. Then when the plasma processing recipe operational condition changes the other preset impedance matching network, having the new tuning parameters, can be quickly (microseconds) substituted with no discernable break in plasma generation operation and damage to the RF power delivery hardware due to the rapid switching under full power delivery. The delivery of RF power by both impedance matching networks can thus be safely alternated back and forth during operation of a plasma processing recipe. This interleaving in operation and impedance transformation capabilities may also be performed with more than two impedance matching networks, and may be beneficial in enabling the use of fixed tuned impedance matching networks instead of requiring variable impedance matching networks having variable tuning capabilities.

In one configuration, the two or more impedance matching networks may be coupled to the same electrode or commonly connected group of electrodes. For example, at least two different impedance matching network outputs, fixed impedance conversion or variable impedance conversion, may be coupled to the same electrode or commonly connected group of electrodes (common output connections to the electrode), and each input of the at least two impedance matching networks may be selectively switched (coupled) to the output of the RF generator. The impedance matching network selected for coupling to the RF generator would determine the impedance conversion between the 50 ohm output of the RF generator and the complex low impedance load of the electrode/plasma. Rapid, microsecond switching between the inputs of the at least two impedance matching networks is possible, according to one or more embodiments of this disclosure. Thus, known or expected plasma chamber impedance changes during one or more process recipe steps may be compensated for to avoid high reflected RF powers being generated due to the inability of the matching network to adjust to the rapidly changing plasma chamber impedance and thus avoid the associated subsequent plasma variations and plasma non-uniformity related issues. In contrast, conventional single impedance matching networks, using motor driven vacuum variable capacitors to adjust to changes in the plasma chamber impedance, may take milliseconds or greater in time to adjust to a new electrode/plasma chamber impedance.

In another configuration, the two or more impedance matching networks may be coupled to respective ones of two or more different electrodes. For example, the RF generator output may be switched between a top electrode (above the substrate support assembly) and a bottom electrode (one embedded in the substrate support assembly). Rapid, microsecond switching between the top and bottom electrodes is possible, according to one or more embodiments of this disclosure.

In some embodiments, the RF voltage, current and phase sensor data from the RF voltage and current sensors may be used for learning purposes and recorded. Thereby, based on the collected sensor data, the impedance characteristics of one or more resonant tuning circuits within the RF source power assembly, comprising the RF generator and impedance matching networks, can be adjusted to better control one or more characteristics of the plasma formed within the plasma processing chamber.

In some embodiments, process control algorithm settings, e.g., RF power process levels and impedance matching network tuning settings may be stored in a memory and subsequently used and/or enhanced for subsequent plasma manufacturing processes. The process control algorithm settings can also include a selection of the various impedance matching network connections that are to be used at different times to provide RF power to one or more electrodes during a plasma processing recipe. Thus, well established and consistent manufacturing process results can be achieved. This is especially advantageous for a large number of chamber plasma processes occurring during a semiconductor device manufacturing day. The same process and matching network tuning recipes may be modified within different process control algorithms depending upon the intended semiconductor manufacturing process required. Different plasma processing recipes may be distributed among the manufacturing plasma chamber systems depending upon the manufacturing requirements for different semiconductor products.

As will be discussed further below, operational information, e.g., RF sensor values and tuning circuit element positions, may be evaluated and adjusted during a semiconductor manufacturing process. The operational process information may be recorded (stored in a memory) for subsequent evaluation and possible refinement for performing future manufacturing processes. For example, the plasma chamber condition can change over time, and different or modified RF delivery sequences may be implemented during a processing recipe to reduce substrate-to-substrate and chamber-to-chamber process result variations.

Referring now to the drawings, the details of example embodiments are schematically illustrated. Like elements in the drawings will be represented by like numbers, and similar elements will be represented by like numbers with a different lower-case letter suffix.

Figure 1B:
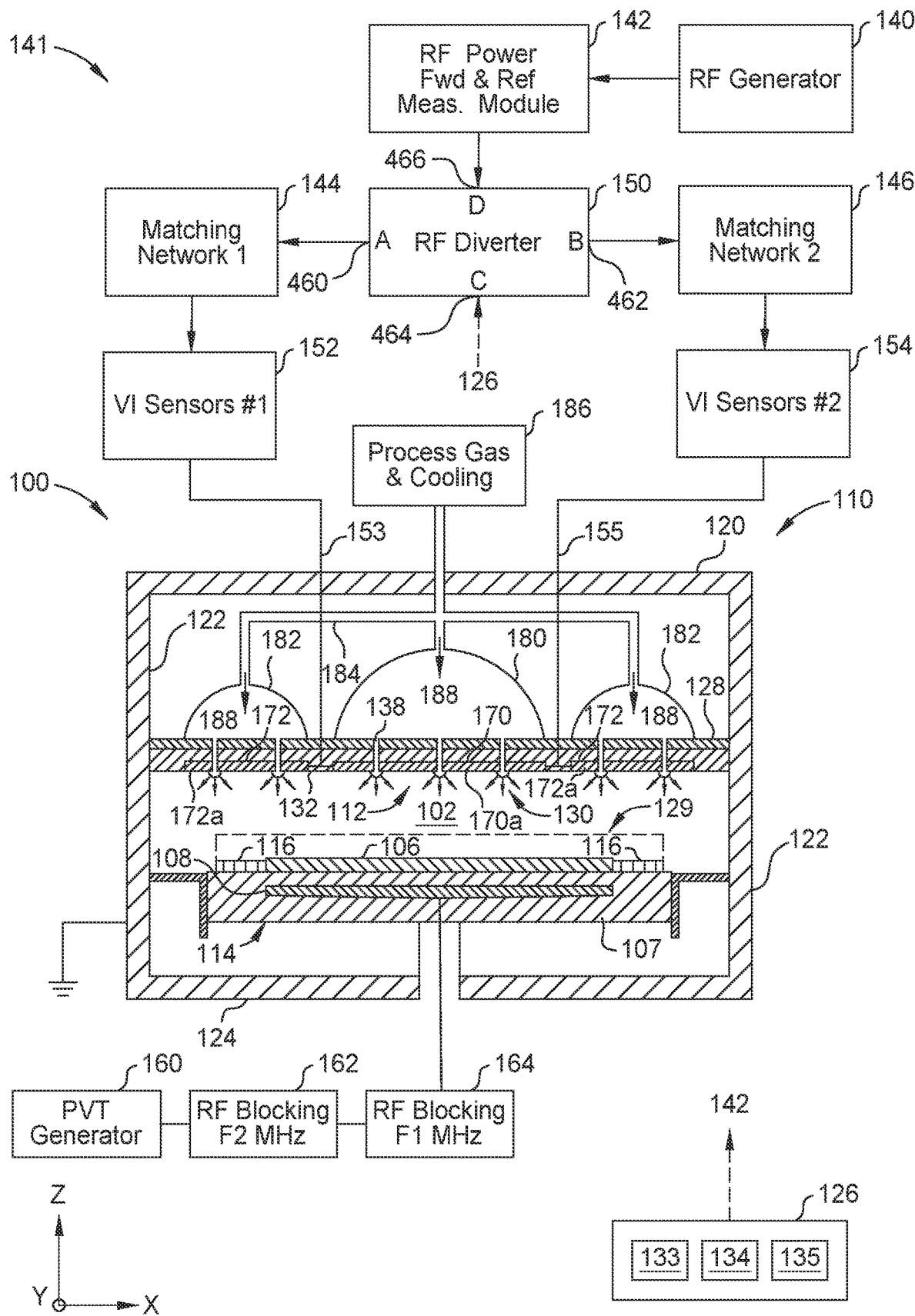

Referring to FIGS. 1A and 1B, depicted are schematic side cross-sectional views of plasma processing chambers and block diagrams of supporting electrical circuits of plasma processing systems, according to one or more embodiments of this disclosure. The plasma processing system, generally represented by the numeral 100, includes a plasma processing chamber 110 having a lid 120, side walls 122 and a chamber base 124. In the plasma processing chamber 110 is a substrate support assembly 114 comprising a dielectric material 107 having an embedded electrode 108, e.g., electrostatic chuck (ESC) biasing electrode, a ring electrode 116, and adapted to support a semiconductor substrate 106 during plasma processing thereto. The substrate support assembly 114 is positioned between the chamber bottom 124 and an RF electrode assembly 112. The volume between the substrate support assembly 114 and the RF electrode assembly 112 provides containment for a plasma 102 within the processing region 129 upon RF excitation thereto. A plasma sheath 104 is also formed over the top of the substrate support assembly 114, ring electrode 116 and the semiconductor substrate 106 during plasma processing.

One example of the RF electrode assembly 112 includes an electrically (RF) non-conductive plate 132 having an outer electrode 172 and an inner electrode 170 on the bottom thereof and facing a substrate supporting surface (i.e., top surface) of the substrate support assembly 114. The outer electrode 172 and/or inner electrode 170 are positioned over at least a portion of the substrate supporting surface of the substrate support assembly 114, and are spaced a first distance from the substrate supporting surface in a first direction (e.g., Z-direction) that is perpendicular to the lower surfaces 170a, 172a of the inner electrode 170 and/or outer electrode 172, which at least partially define a portion of the processing region of the plasma processing chamber 110. A ground plate (RF shield) 128 is attached to the top of the non-conductive plate 132 and may be electrically coupled to the grounded walls 122 of the plasma chamber 110. Gas ports 138 provide fluid (gas), through the ground plate 128 and the inner electrode 170 and outer electrode 172, to gas distribution head 130 that includes a plurality of gas ports. Process gas 188 is distributed from a process gas source 186 through gas distribution piping 184 to gas distribution sub-chambers 180 and 182, where the process gas is distributed into the volume between the RF electrode assembly 112 and the substrate support assembly 114 to become a plasma 102 upon RF excitation thereto.

An RF source power assembly 141 for exciting the process gas into a plasma may comprise an RF generator 140, an RF power measurement module 142, an RF diverter 150, a first RF impedance matching network 144, a second RF impedance matching network 146, and RF voltage and current sensors 152 and 154. The RF generator 140 may be adapted to provide RF power at frequencies from about 1 MHz to about 200 MHz, e.g., 1 MHz, 13.56 MHz, 40 MHz. RF power output from the RF power generator 140 may be from about 100 to about 5,000 Watts (W). The RF power may also be pulsed on and off at a pulse rate of from about one Hertz (Hz) to about 100 kHz, with an on/off duty cycle from about five (5) percent to about 95 percent.

The output of a DC pulse generator (PVT) 160 may be coupled to the embedded electrode 108 in the substrate support assembly 114. The embedded electrode 108 can be an electrostatic chucking electrode that is disposed within an electrostatic chuck within the substrate support assembly 114. RF blocking filters 162 and 164 may be coupled between the DC pulse generator 160 and the embedded electrode 108, and may be used to substantially block RF energy from getting into the DC pulse generator 160. In general, the pulsed voltage (PV) waveforms established with the embedded electrode 108, such as either the negative pulse waveforms, shaped pulse waveforms or positive pulse waveforms, include a periodic series of pulse voltage (PV) waveforms repeating with a period $T_{PD}$, on top of a voltage offset ($\Delta V$). In one example, the period $T_{PD}$ of the PV waveforms can be between about 1 µs and about 5 µs, such as about 2.5 µs, e.g., between about 200 kHz and about 1 MHz, or about 400 kHz, such as about 1 MHz or less, or about 500 KHz or less. The DC pulse generator 160 may be adapted to deliver asymmetric DC pulses to the embedded electrode 108 for control of the plasma sheath 104 formed over the surface of the semiconductor substrate 106.

Figure 2:
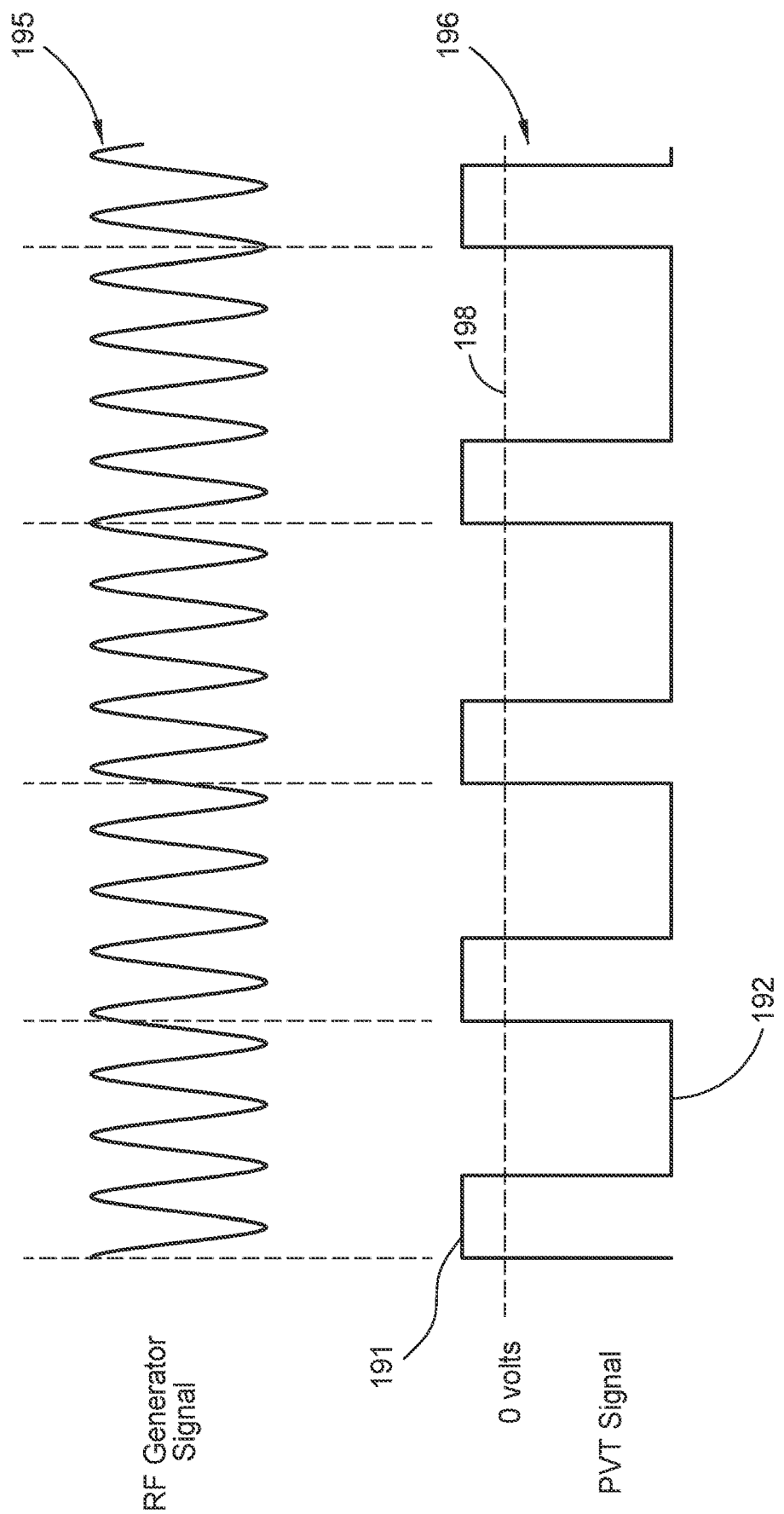
FIG. 2 illustrates voltage pulses provided within a voltage waveform that are delivered to a first electrode and an RF signal that is simultaneously delivered to a second electrode during plasma processing, according to one or more embodiments.

However, as illustrated in FIG. 2, in plasma processing configurations where a PV waveform 196 and an RF signal 195 are simultaneously being provided to one or more electrodes disposed within the processing region 129 to form a plasma 102 therein, the impedance of the complex load created by the plasma 102 will fluctuate at least in part due to the varying voltage applied in each of the voltage pulses provided in the PV waveform provided from the PVT generator 160. In some other plasma processing configurations where pulsed RF signals are provided to the processing region 129 of plasma processing chamber 100 to form a plasma 102 therein, the impedance of the complex load created by the plasma 102 will fluctuate at least in part due to the varying RF power level. One skilled in the art will appreciate that the impedance of the complex load will vary during the different states of the PV waveform provided to the electrode 108 positioned below the substrate 106, such as a first state 191 (i.e., sheath collapse phase) and a second state 192 (i.e., ion current phase) and/or during the different phases of a pulsed RF signal, when provided. As illustrated in FIG. 2 by the zero volt reference line 198, in some embodiments the PV waveform can include the generation of a positive voltage during the first state 191 and the generation of a larger magnitude negative voltage during the second state 192. However, the varying impedance of the complex load requires the RF matching elements, which are used to ensure the efficient delivery of RF power to the complex load, to make impedance tuning adjustments in response to the varying impedance in an effort to ensure that the maximum forward RF power is provided to the complex load while the amount of reflected power is minimized at any time. However, as noted above, most conventional RF matching networks include mechanical tuning elements that are unable to keep up with the rate that the impedance that the complex load is varying, which leads to large fluctuations in the match point, the amount of reflected RF power and inefficiency and/or damage to the power delivery system. Therefore, as discussed above, there is a need to control and synchronize the delivery of an RF signal provided from the RF generator 140 to one or more electrodes within the processing chamber 100 through the use of different RF matching networks at different times, which are each tuned to match at different impedances, so that no discernable break in plasma generation operation due to the changing impedance of the complex load. In one example, as is discussed further below, the RF diverter 150 is configured to rapidly switch between a first RF delivery path that is coupled to one or more electrodes to compensate for the plasma impedance formed during the first state 191 of the PV waveform and then switch to a second RF delivery path coupled to the one or more electrodes during the second state 192 of the PV waveform to compensate for the change in the plasma impedance (e.g., change in the generated plasma sheath over the substrate) formed due to the difference in the complex load impedance due to the differing applied voltage provided to the plasma 102 during the first state 191 and the second state 192 of the PV waveform.

In some embodiments, the plasma processing chamber 110 may be configured for plasma-assisted etching processes, such as a reactive ion etch (RIE) plasma processing. The plasma processing chamber 110 may also be used in other plasma-assisted processes, such as plasma-enhanced deposition processes (for example, plasma-enhanced chemical vapor deposition (PECVD) processes, plasma-enhanced physical vapor deposition (PEPVD) processes, plasma-enhanced atomic layer deposition (PEALD) processes, plasma treatment processing, plasma-based ion implant processing, or plasma doping (PLAD) processing.

A system controller 126, also referred to herein as a processing chamber controller, includes a central processing unit (CPU) 133, a memory 134, and support circuits 135. The system controller 126 is used to control the process sequence used to process the substrate 106, such as control of the RF diverter for selection of which matching network 144 or 146 receives RF power from the RF generator 140 as described more fully hereinafter. The CPU 133 may be a general-purpose computer processor configured for use in an industrial setting for controlling the processing chamber and sub-processors related thereto. The memory 134 described herein, which is generally non-volatile memory, may include random access memory, read-only memory, floppy or hard disk drive, or other suitable forms of digital storage, local or remote. The support circuits 135 are conventionally coupled to the CPU 133 and comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the system controller 126 determines which tasks are performable by the components in the processing chamber 110 and plasma processing system 100.

Typically, the program stored in memory 134, which is readable by CPU 133 in the system controller 126, includes code, which, when executed by the processor (CPU 133), performs tasks relating to the plasma processing schemes described herein. The program may include instructions that are used to control the various hardware and electrical components within the processing chamber 110 to perform the various process tasks and various process sequences used to implement the methods described herein.

Figure 3A:
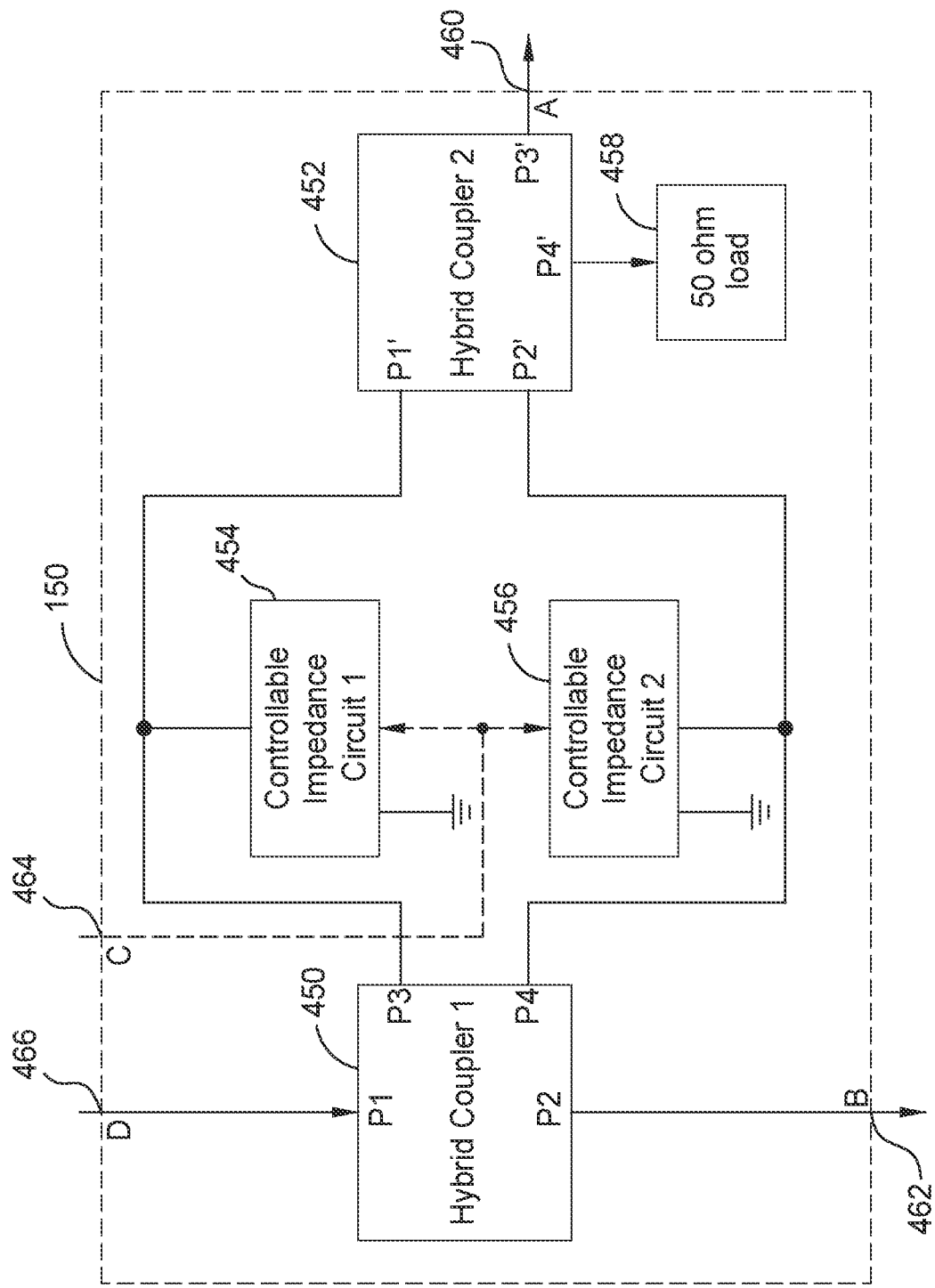
FIG. 3A illustrates a schematic circuit and block diagram of an RF diverter comprising two controllable impedance circuits and two hybrid couplers, according to one or more embodiments of this disclosure.

Referring to FIG. 3A, depicted is a schematic circuit and block diagram of an RF diverter comprising two controllable impedance circuits and two hybrid couplers, according to one or more embodiments of this disclosure. FIG. 3A generally illustrates the function of an RF diverter 150 that is configured to selectively deliver RF power from the RF generator to different RF delivery paths coupled to the same or different electrodes positioned within the plasma processing chamber 110. In the example shown in FIG. 1B, a single RF diverter 150 is configured to deliver RF power to a combined electrodes 170a and 172a through either of the RF delivery paths 153 or 155. The RF power provided from the RF generator 140 and through the RF power measurement module 142 can be separately delivered along path 153 or path 155 due to a control signal at input node 464 provided from the system controller 126. The settings of internal impedance adjusting components within the first match 144 and second match 146 are pre-set to compensate for different complex load impedances during a plasma process, the RF port provided by the RF generator 140 can be rapidly switched to compensate for the different complex load impedances that are experienced during processing. In one example, the switching between different RF delivery paths is synchronized with the establishment of the different PV waveform states created by the PV generator 160, such as the first state 191 and second state 192 discussed hereinabove and shown FIG. 2.

The RF diverter 150 comprises a first hybrid coupler 450, a second hybrid coupler 452, a first controllable impedance circuit 454, a second controllable impedance circuit 454, and a 50 ohm load 458. The hybrid couplers 450, 452 may be four port 3 dB hybrid couplers that phase shift an input signal to two output signals having a phase shift there between. The first and second controllable impedance circuits 454, 456 are either a first impedance (high) at the frequency of the RF generator when a control signal 464 is at a first logic level, or a second impedance (low) when the control signal 464 is at a second logic level, as more fully described hereinafter.

The hybrid coupler ports coupled to the first and second controllable impedance circuits 454, 456, are at a low RF impedance, typically at 50 ohms transmission line impedance. The first and second controllable impedance circuits 454, 456 are in shunt between the ports of the hybrid couplers as shown and equipment common (e.g., ground). The first and second controllable impedance circuits 454, 456, are in a high impedance parallel resonant configuration, at the RF generator frequency of operation, when the control signal 464 is at the first logic level, and therefore do not affect RF operation between the RF ports of the hybrid couplers 450, 452.

RF power from the RF generator 140 is supplied to a first RF input 466 of the RF diverter 150, coupled to port P1 of the hybrid coupler 450. The RF power is split between ports P3 and P4 of the hybrid coupler 450, where half of the RF power is output from port P3 at 180 degrees phase shift and the other half of the RF power is output from port P4 at 270 degrees phase shift from the input RF power at port P1 of the hybrid coupler 450. These two half power feeds, 90 degrees out pf phase, are coupled to input ports P1' and P2' of the hybrid coupler 452. These two half power feeds, 90 degrees apart, are combined back into a single RF power output at port P3' of the hybrid coupler 452 and available as full power RF at output 460 of the RF diverter 150. Any difference in RF power and phase, not at 90 degrees, will be coupled from port P4' of the hybrid coupler 452 to the 50 ohm load 458.

The first and second controllable impedance circuits 454, 456 are in a low impedance configuration when the control signal 464 is at the second logic level. This effectively RF couples ports P3 and P4 of the hybrid coupler 450 and ports P1' and P2' of the hybrid coupler 452 to equipment common, e.g., ground. Now the hybrid coupler 450 port P2 receives full RF power from its port P1 and is available as full power RF at output 462 of the RF diverter 150. No RF power is supplied to ports P1' and P2' of the hybrid coupler 452 since these ports are effectively at RF ground, thus no output power will be at port P3' of the hybrid coupler 452 coupled to output 460 of the RF diverter 150.

Figure 3B:
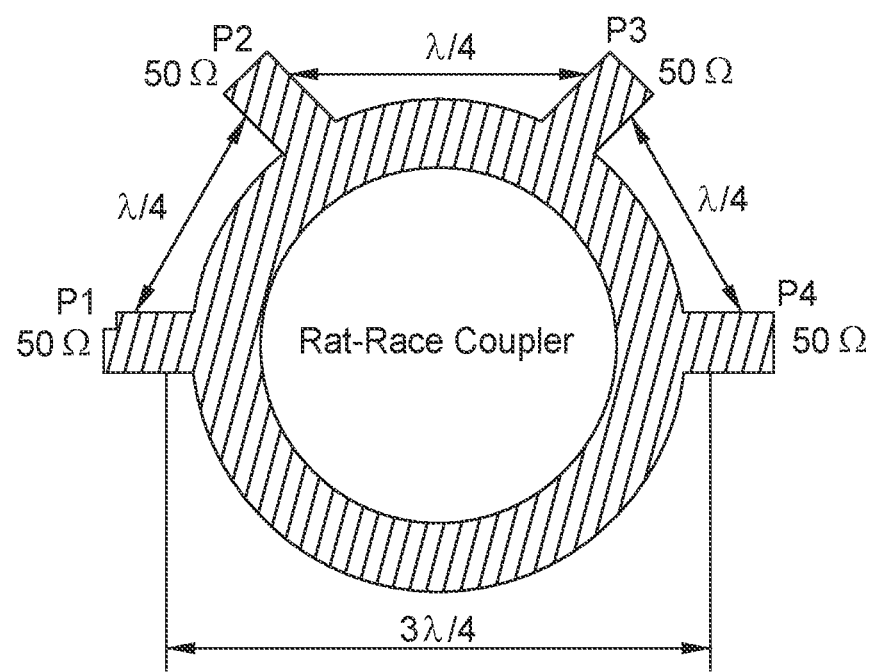
FIG. 3B illustrates a schematic plan view of a four port hybrid coupler, according to teachings of this disclosure.

Referring to FIG. 3B, depicted is a schematic plan view of a four port hybrid coupler, according to teachings of this disclosure. Shown is a strip line 3 dB hybrid coupler. Ports P1 and P2, P2 and P3, and P3 and P4 are coupled together electrically through $\lambda/4$ sections. This diagram is representative of a four port rat-race coupler.

Figure 3C:
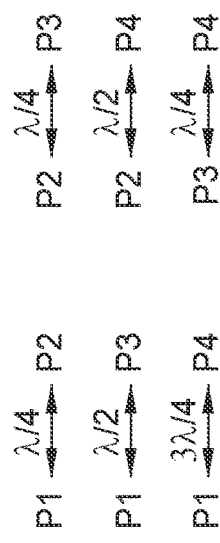
FIG. 3C illustrates a schematic diagram of a four port hybrid coupler comprising quarter wave coaxial cable sections and phase delay combinations through the coaxial cable sections, according to teachings of this disclosure.
Figure 3C:
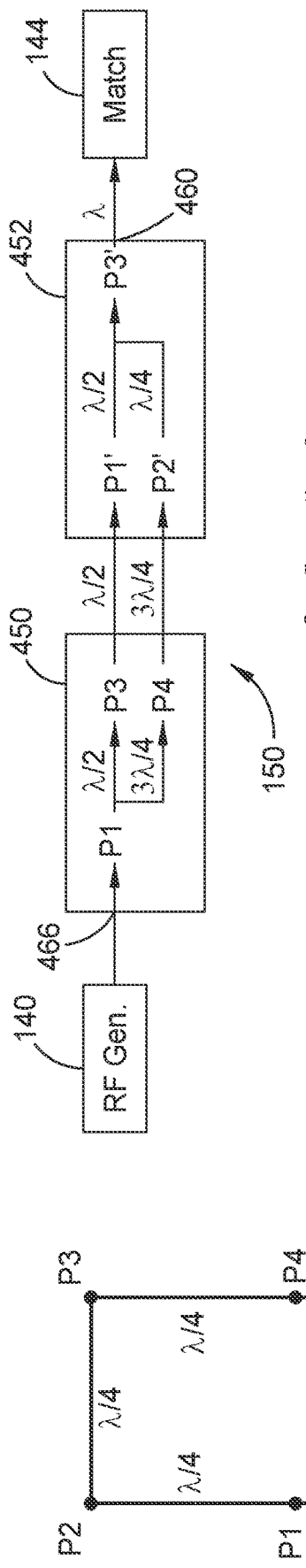
Figure 3C:
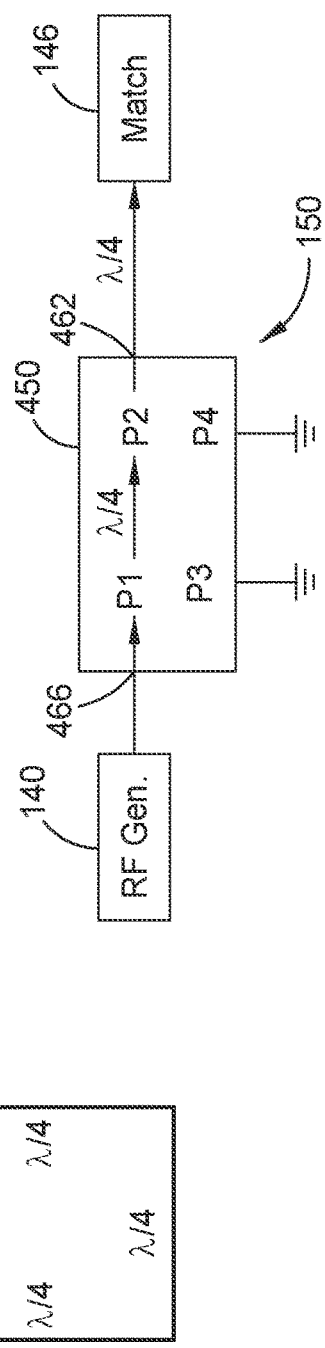

Referring to FIG. 3C, depicted is a schematic diagram of a four port hybrid coupler comprising quarter wave coaxial cable sections and phase delay combinations through the coaxial cable sections, according to teachings of this disclosure. For lower frequency operation, a 3 dB hybrid couple may be built from quarter wave ($\lambda$4) coaxial sections connected together with coaxial T-connectors forming connections between the quarter wave coaxial sections and providing port connections to the quarter wave sections. Coax for the quarter wave sections may be selected to handle the RF power generated by the RF generator 140. The characteristic impedance of the coax may be 50 ohms, but is not limited thereto.

RF power from the RF generator 140 is coupled to input 466 of the RF diverter 150 (port P1 of the hybrid coupler 450), and when the first and second controllable impedance circuits 454, 456 are in a high impedance parallel resonant configuration (Configuration 1), the RF power into port P1 goes out ports P3 and P4, each having one-half power of the RF generator 140 and a phase shift there between of $\lambda/4$ (90 degrees). The half RF powers from ports P3 and P4 are coupled to ports P1' and P2' of the hybrid coupler 452, where they are recombined in the hybrid coupler 452 at port P3' resulting in full power to the output 460 of the RF diverter 150.

When the first and second controllable impedance circuits 454, 456 are in a low impedance configuration (Configuration 2), ports P3 and P4 of the hybrid coupler 450 are at substantially RF ground (equipment common), and the RF power into port P1 goes out port P2 at full power. Port P3 is λ/4 (90 electrical degrees) from port P2, and port P4 is 3λ/4 (270 electrical degrees) from port P1. A quarter wavelength (λ/4) or multiple quarter wavelength (3λ/4) transmission line will appear as an open circuit (very high impedance) at one end thereof when the other end (center conductor and coaxial shield) are shorted together, e.g., to RF ground (equipment common). Therefore, grounded ports P3 and P4 appear to ports P2 and P1, respectively, as not being in or affecting the RF power path. Whereby port P1 is coupled directly to port P2 with substantially no power loss there between.

In configuration 1, shown in FIG. 3C, phasing of the RF power paths produces a 360 degree phase shift (1 cycle) between the RF power to input 466 and the RF power output 460 of the RF diverter 150. In configuration 2, phasing of the RF power path produces a 90 degree phase shift between the RF power at input 466 and the RF power at output 462 of the RF diverter 150.

Figure 4:
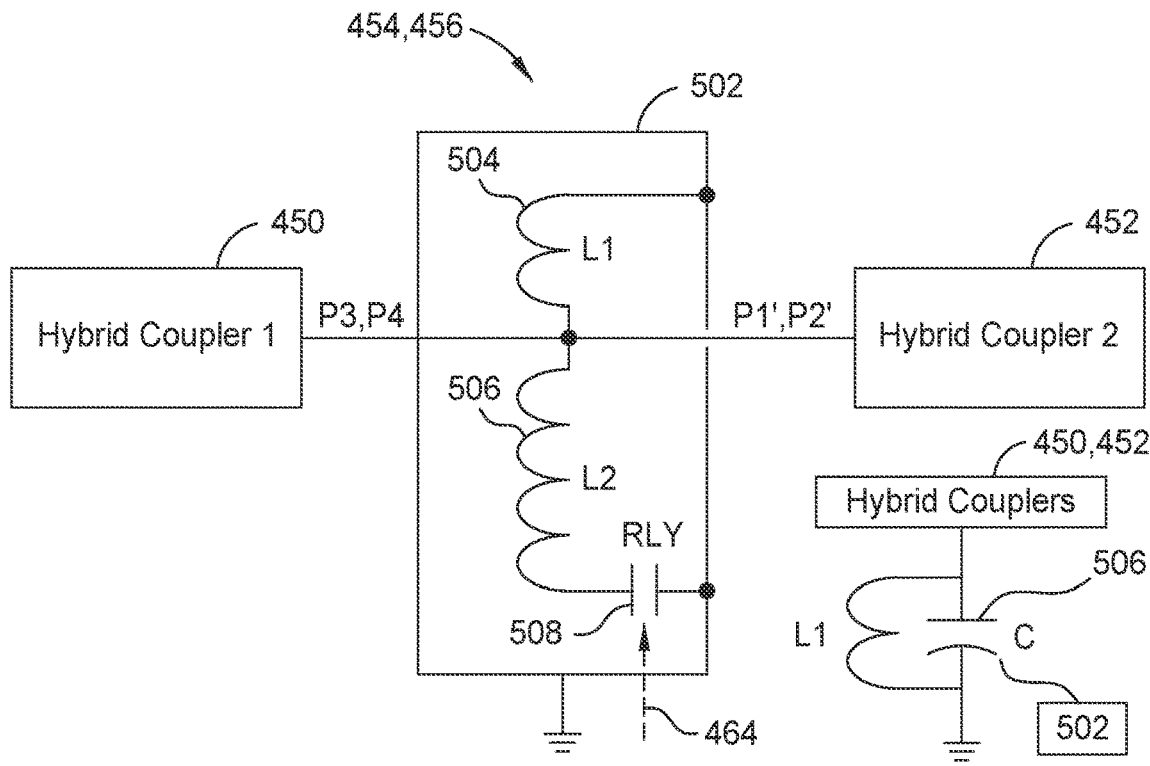
FIG. 4 illustrates a schematic circuit diagram of a controllable impedance circuit (two used in FIG. 3A), according to one or more embodiments of this disclosure.
Figure 5:
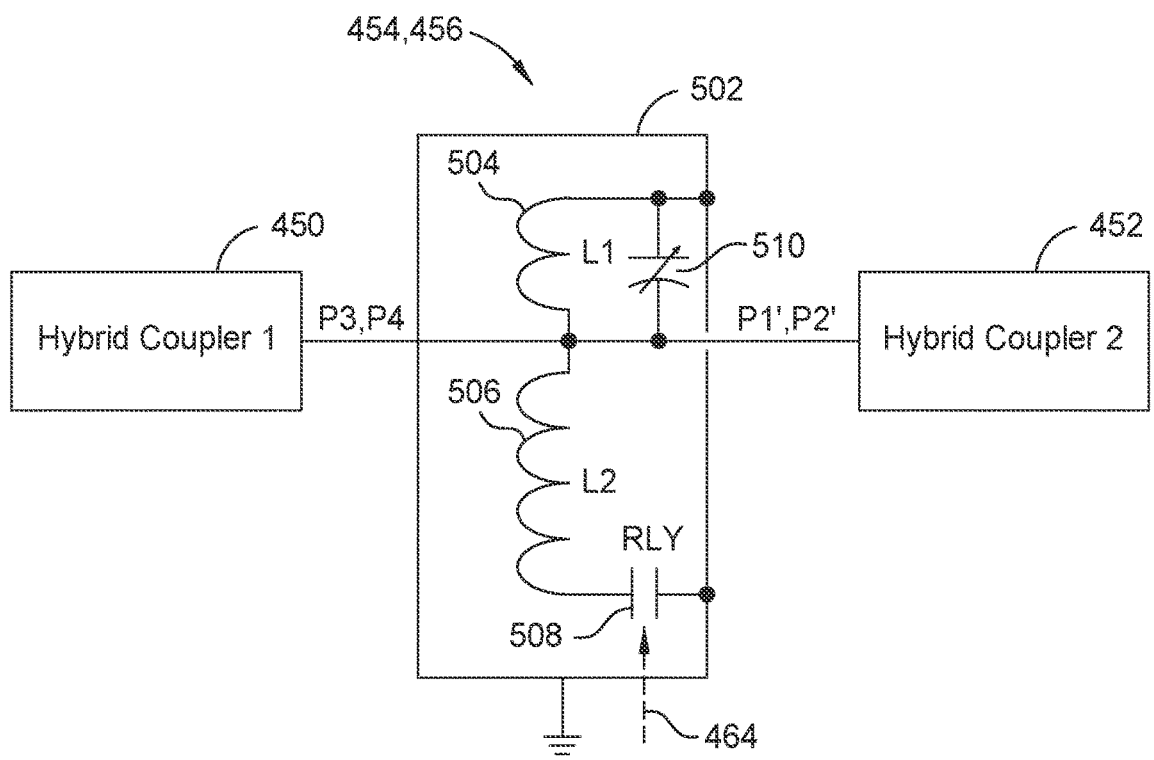
FIG. 5 illustrates a schematic circuit diagram of a lower frequency version of a controllable impedance circuit (two used in FIG. 3A), according to one or more embodiments of this disclosure.
Figure 5A:
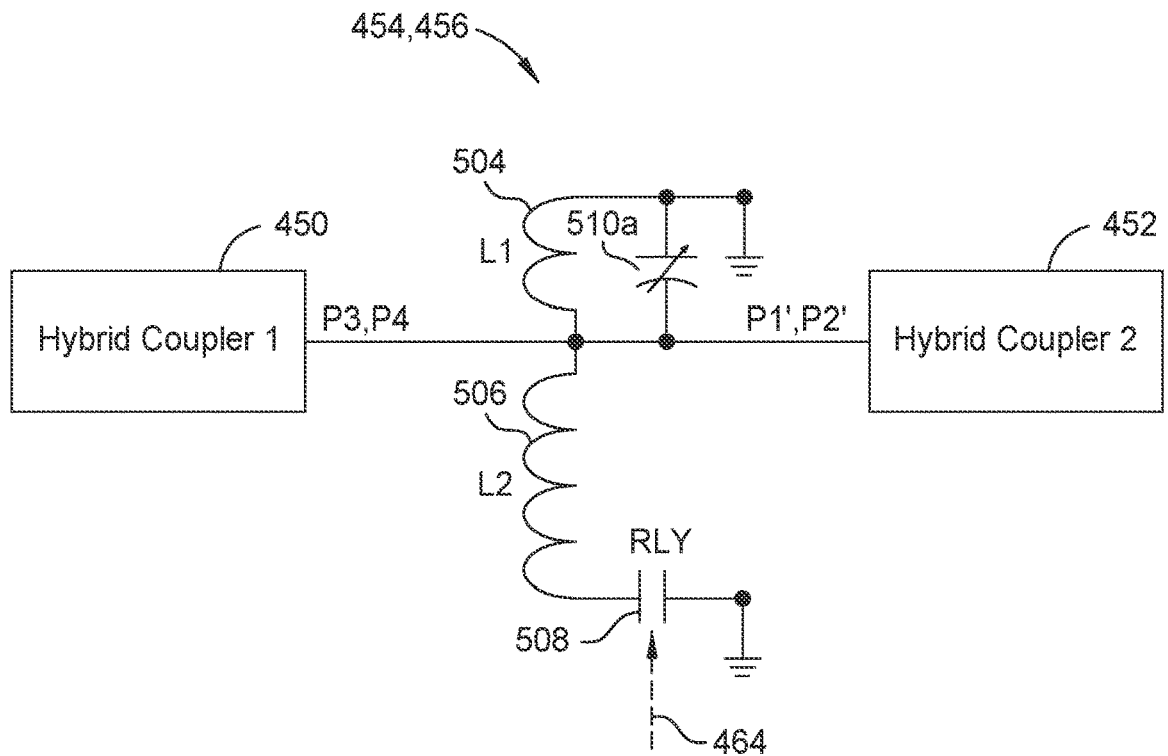
FIG. 5A illustrates a schematic circuit diagram of a controllable impedance circuit (two used in FIG. 3A), according to one or more embodiments of this disclosure.

Referring to FIG. 4, depicted is a schematic circuit diagram of the controllable impedance circuits shown in FIG. 3A, according to one or more embodiments of this disclosure. Each of the controllable impedance circuits 454, 456 includes at least one inductor that comprises a first inductor portion 504, a second inductor portion 506, a switch 508, e.g., an electrically operable switch (relay) or manually operable switch, having first and second electrical contacts, and a RF conductive enclosure 502 configured and connected as shown. In some embodiments, the at least one inductor can include two discrete inductive elements, wherein in this case the first inductor portion 504 and second inductor portion 506 each comprise separate discrete inductive elements. While not intending to limit the disclosure provided herein, for ease of discussion purposes the first inductor portion 504 and the second inductor portion 506 will simply be referred to herein as a first inductor 504 and a second inductor 506, but, as noted above, in some cases could be formed from different portions of a single inductor (coil) or could be separate discrete inductors (coils), as shown in FIGS. 4, 5 and 5A. The first inductor 504 has a first inductance, the second inductor 506 has either a parallel capacitance C when the first and second electrical contacts of the switch 508 are open or a second inductance when the first and second electrical contacts of the switch 508 are closed. The switch 508 may be a high voltage relay such as, for example but limited to, a vacuum contact relay. When a control voltage 464 is applied to a relay contact actuator (not shown), the first and second electrical contacts of the switch 508 will close and may connect the free end of the inductor 506 to the RF conductive enclosure 502 (RF ground).

When the first and second electrical contacts of the switch 508 are open, the second inductor 506 forms one plate of a capacitor and the RF conductive enclosure 502 forms the other plate of the capacitor. The capacitor formed by the inductor 506 and the RF conductive enclosure 502 will be in parallel with the first inductor 504, forming a parallel resonant high impedance circuit. An inductance value for the first inductor 504 and capacitance value for the second inductor 506 (acting as one capacitor plate) and RF conductive enclosure 502 may be selected to be parallel resonant at the output frequency of the RF generator 140, such as 40 MHz. The RF conductive enclosure 502 may be made of, but is not limited to, copper, aluminum, RF conductive plated substrate, e.g., printed circuit boards configured as an enclosure and grounded with the plasma generating equipment.

When the first and second electrical contacts of the switch 508 are closed, the second inductor 506 forms an inductance in parallel with the inductance of the first inductor 504. This of course negates the parallel resonant circuit created when first and second electrical contacts of the switch 508 are open, as described above. Now there are two inductances in parallel, where the inductive reactance is $X_{Lt}=X_{L1}*X_{L2}/(X_{L1}+X_{L2})$, which is less than either inductive reactance of the coils 502 and 504. If $X_{L1}<X_{L2}$ then the RF current through the first and second electrical contacts of the switch 508 will be less than the current through $X_{L1}$, thus "hot switching" the first and second electrical contacts of the switch 508 under full RF power will not be catastrophic since more RF current will pass through the inductor 504 than the inductor 506. Also, the switched RF voltage will be less because $X_{L1}$ has a lower impedance than $X_{L2}$. The first and second electrical contacts of the switch 508 are at the "cold" end of the inductor 506 and will include less RF voltage across it when opening. These factors allow RF switching of the first and second electrical contacts of the switch 508, both open and closed, at full RF power without damage thereto and at microsecond speeds, e.g., for example but not limited to, ten (10) microseconds.

Referring to FIG. 5, depicted is a schematic circuit diagram of a lower frequency version of the controllable impedance circuits shown in FIG. 3A, according to one or more embodiments of this disclosure. At lower RF frequencies (longer wavelengths), the combination of the inductor coil 506 and the RF conductive enclosure 502 may not provide enough capacitance to form a parallel resonant circuit with the first inductor 504 at a desired frequency, such as 13.56 MHz, 2 MHz, etc. In that case, a second capacitor 510 may be added in parallel with the first inductor 504. The second capacitor 510 may be fixed or variable.

Referring to FIG. 5A, depicted is a schematic circuit diagram of the controllable impedance circuits shown in FIG. 3A, according to one or more embodiments of this disclosure. The RF conductive enclosure 502 is not used in this embodiment and a capacitor 510a is sized in capacitive value to parallel resonant, at the RF generator frequency, with the inductor 504. When the first and second electrical contacts of the switch 508 are closed the inductor 506 is placed in parallel with the inductor 506, thereby lowering the combined inductance value of inductors 504 and 506 and raising the parallel resonant frequency thereof. The impedance of the inductor 506 will limit the RF current through the first and second electrical contacts of switch 508 when they are closed. The capacitor 510a may be fixed or variable.

Figure 5B:
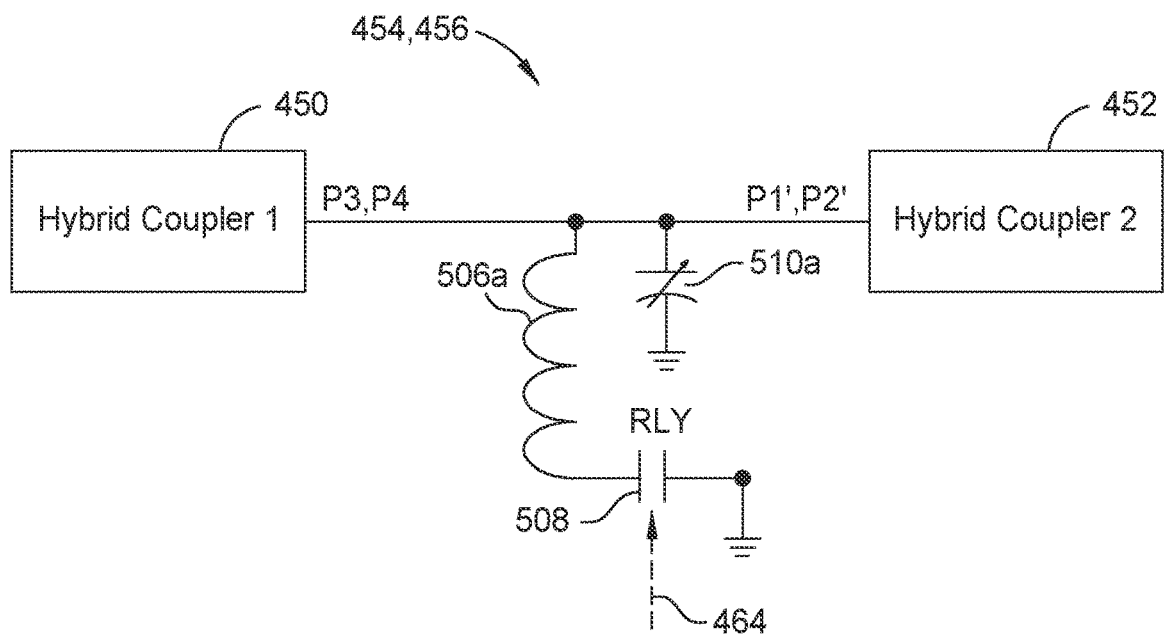
FIG. 5B illustrates a schematic circuit diagram of a controllable impedance circuit (two used in FIG. 3A), according to one or more embodiments of this disclosure.

Referring to FIG. 5B, depicted is a schematic circuit diagram of the controllable impedance circuits shown in FIG. 3A, according to one or more embodiments of this disclosure. A capacitor 510a is sized in capacitive value to parallel resonant, at the RF generator frequency, with the inductor 506a when the first and second electrical contacts of the switch 508 are closed, thereby providing a high impedance parallel resonant circuit between the hybrid coupler nodes and equipment common (ground). The RF conductive enclosure 502 is not used in this embodiment. When the first and second electrical contacts of the switch 508 are open the inductor 506a is no longer in the circuit and all RF current flows through the capacitor 510a which has a low RF impedance at the RF generator frequency of operation. The impedance of the inductor 506a will limit the RF current through first and second electrical contacts of the switch 508 when they closed. The capacitor 510a may be fixed or variable.

It is contemplated and within the scope of this disclosure that one having ordinary skill in the art of RF circuits and the benefit of this disclosure could design other RF circuits that could be used as a controllable impedance circuit that may be configured for a first impedance at a frequency when in a parallel resonant configuration and a second impedance when not in the parallel resonant configuration at the frequency. Wherein the first impedance is greater than the second impedance.

Figure 6:
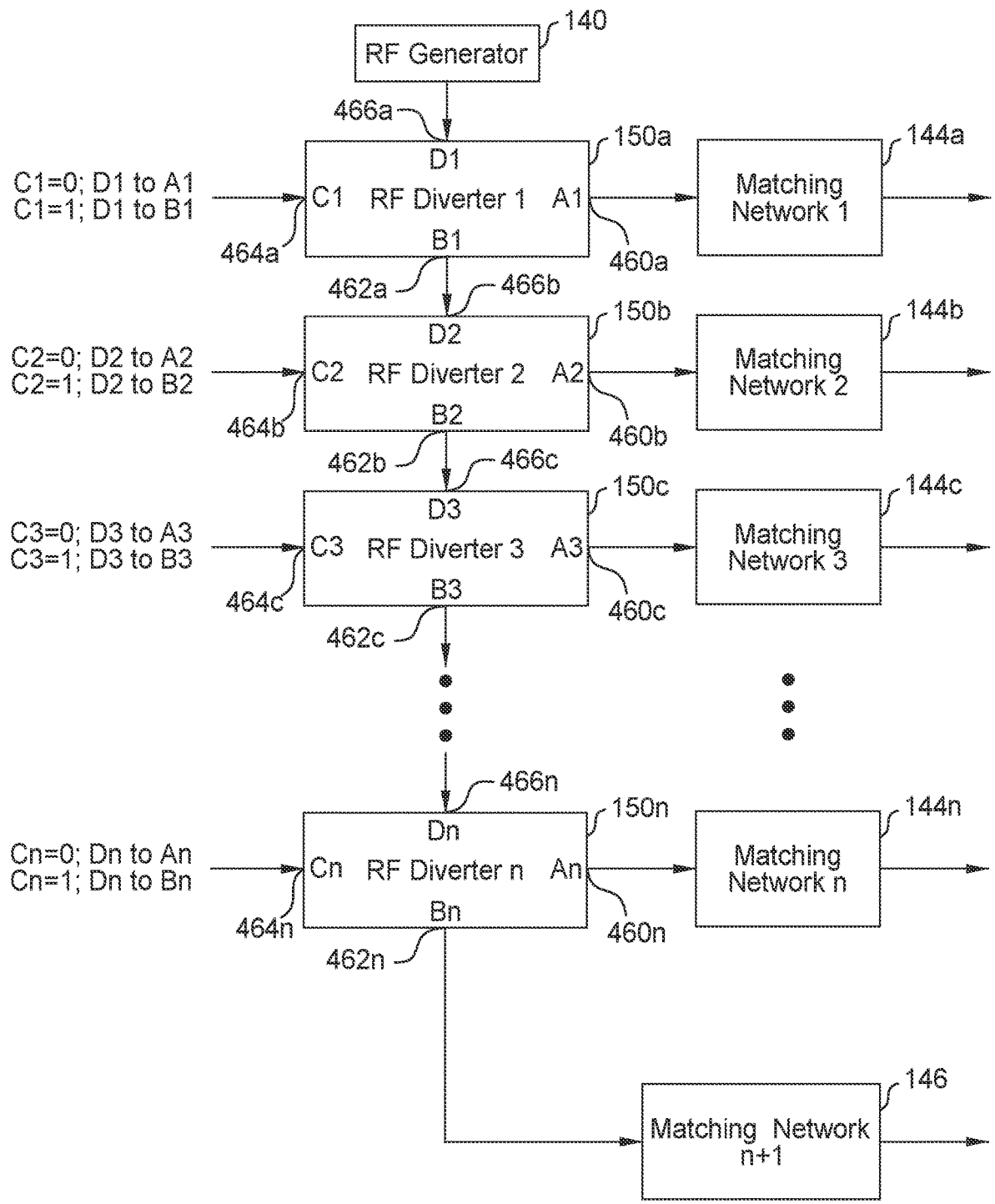
FIG. 6 illustrates a schematic block diagram of a plurality of RF diverters and associated impedance matching networks, according to one or more embodiments of this disclosure.

Referring to FIG. 6, depicted is a schematic block diagram of a plurality of RF diverters and associated impedance matching networks, according to one or more embodiments of this disclosure. The output of the RF generator 140 is coupled to a first input port 466a of the RF Diverter 150a. When a control input 464a is at a logic 0 (logic low), the first input port 466a is coupled to a first output port 460a, and the impedance matching network 144a receives RF power from the RF generator 140. When the control input 464a is at a logic 1 (logic high), the first input port 466a is coupled to a second output port 462a, which is coupled to a first input port 466b of the RF diverter 150b. It is contemplated and within the scope of this disclosure that the logic levels to the control input 464 are interchangeable and may be either logic 0, 1 or 1, 0 (inverted but serves the same control functions).

When a control input 464b is at a logic 0 (logic low), the first input port 466b of the RF Diverter 150b is coupled to a first output port 460b, and the impedance matching network 144b receives RF power from the RF generator 140 through RF diverters 150a and 150b. When the control input 464b is at a logic 1 (logic high), the first input port 466b is coupled to a second output port 462b, which is coupled to a first input port 466c of the RF diverter 150c.

When a control input 464c is at a logic 0 (logic low), the first input port 466c of the RF Diverter 150c is coupled to a first output port 460c, and the impedance matching network 144c receives RF power from the RF generator 140 through RF diverters 150a, 150b and 150c. When the control input 464c is at a logic 1 (logic high), the first input port 466c is coupled to a second output port 462c, which is coupled to a first input port 466n of the RF diverter 150n (through a plurality of RF diverters, not shown).

When a control input 464n is at a logic 0 (logic low), the first input port 466n of the RF Diverter 150n is coupled to a first output port 460n, and the impedance matching network 144n receives RF power from the RF generator 140 through RF diverters 150a through 150n. When the control input 464n is at a logic 1 (logic high), the first input port 466n is coupled to a second output port 462n, which may be coupled to a last impedance matching network 146. Thus, RF power from the RF generator 140 passes through at least one of the plurality of RF diverters 150. One of the plurality of impedance matching networks 144, 146 associated with the RF diverter 150 (having its control input at a logic 0) will supply RF power to the RF electrodes, e.g., 170, 172 or 108 associated therewith. Depending on which one of the RF diverters 150, e.g., diverter 150c, has its control input 464c at a logic 0, the RF diverters 150 between this diverter 150c, e.g., diverters 150a and 150b, will have their control inputs 464 at a logic 1. Thus, selection of impedance matching networks 144, 146 may be done at full RF power and within microseconds.

Table 1 provided below illustrates an example of a plasma process performed on a substrate, which includes four process recipe steps that utilize four different electrodes (i.e., n=4 in FIG. 6) disposed within a plasma chamber during processing. The output of the diverters 150a, 150b, 150c and 150d during each of the recipe steps, which is based on the logic level signals sent by the system controller 126, is described for each of the process recipe steps.

TABLE 1

| Recipe Step | Logic State | | | | Output |
|---|---|---|---|---|---|
| | C1 | C2 | C3 | C4 | |
| 1 | 0 | 1 | 1 | 1 | RF power is provided to Matching Network 1, which is coupled to a first electrode. |
| 2 | 1 | 0 | 1 | 1 | RF power is provided to Matching Network 2, which is coupled to a second electrode. |
| 3 | 1 | 1 | 0 | 1 | RF power is provided to Matching Network 3, which is coupled to a third electrode. |
| 4 | 0 | 1 | 1 | 1 | RF power is provided to Matching Network 1, which is coupled to the first electrode. |

While the foregoing is directed to embodiments of the present disclosure, other and further embodiments of the disclosure may be devised without departing from the basic scope thereof, and the scope thereof is determined by the claims that follow.

What is claimed is:

1. A radio frequency (RF) diverter assembly, comprising:
   a first hybrid coupler having four RF ports;
   a second hybrid coupler having four RF ports; wherein
      a first RF port of the first hybrid coupler is coupled to a first RF port of the second hybrid coupler, and
      a second RF port of the first hybrid coupler is coupled to a second RF port of the second hybrid coupler;
   a first controllable impedance circuit having a first node coupled to the first RF ports of the first and second hybrid couplers and a second node coupled to an equipment common,
   a second controllable impedance circuit having a first node coupled to the second RF ports of the first and second hybrid couplers and a second node coupled to the equipment common; and
   the first and second controllable impedance circuits have a first impedance at a frequency when configured to be parallel resonant at the frequency, and a second impedance when configured to not be parallel resonant at the frequency, wherein the first impedance is greater than the second impedance.

2. The RF diverter assembly according to claim 1, wherein
   a third RF port of the first hybrid coupler is coupled to a third RF port of the second hybrid coupler when the first and second controllable impedance circuits are at the first impedance; and
   the third RF port of the first hybrid coupler is coupled to a fourth RF port of the first hybrid coupler when the first and second controllable impedance circuits are at the second impedance.

3. The RF diverter assembly according to claim 1, wherein the first controllable impedance circuit comprises:
   a switch having first and second electrical contacts, the second electrical contact coupled to the second node;
   a first impedance producing element coupled between the first node and the second node; and
   a second impedance producing element coupled between the first node and the first electrical contact;

wherein
when the first and second electrical contacts are open the first controllable impedance circuit is at the first impedance, and
when the first and second electrical contacts are closed the first controllable impedance circuit is at the second impedance.

4. The RF diverter assembly according to claim 1, wherein the second controllable impedance circuit comprises:
a switch having first and second electrical contacts, the second electrical contact coupled to the second node;
a first impedance producing element coupled between the first node and the second node; and
a second impedance producing element coupled between the first node and the first electrical contact;
wherein
when the first and second electrical contacts are open the second controllable impedance circuit is at the first impedance, and
when the first and second electrical contacts are closed the second controllable impedance circuit is at the second impedance.

5. The RF diverter assembly according to claim 4, wherein
the first impedance producing element of the first and second controllable impedance circuits is a first inductor;
the second impedance producing element of the first and second controllable impedance circuits is a capacitor when the first and second electrical contacts are open, and a second inductor when the first and second electrical contacts are closed;
whereby the first and second impedance producing elements form a parallel resonate circuit at the frequency when the first and second electrical contacts are open.

6. The RF diverter assembly according to claim 5, wherein the second impedance producing element has a higher impedance value than the first impedance producing element when the first and second electrical contacts are closed.

7. The RF diverter assembly according to claim 4, wherein
the first impedance producing element of the first and second controllable impedance circuits is a first inductor and a capacitor connected in parallel with the first inductor; and
the second impedance producing element of the first and second controllable impedance circuits is a second inductor when the first and second electrical contacts are closed;
whereby
the first impedance producing element forms a parallel resonate circuit at the frequency and having the first impedance when the first and second electrical contacts are open, and
the first and second impedance producing elements form a non-resonate circuit at the frequency and having the second impedance when the first and second electrical contacts are closed.

8. The RF diverter assembly according to claim 4, wherein the first and second electrical contacts are first and second relay contacts that are remotely controllable.

9. The RF diverter assembly according to claim 1, wherein the first controllable impedance circuit comprises:
a switch having first and second electrical contacts, the second electrical contact coupled to the second node;
a first impedance producing element coupled between the first node and the second node; and
a second impedance producing element coupled between the first node and the first electrical contact;
wherein
the first and second controllable impedance circuits form a parallel resonate circuit at the frequency and having the first impedance when the first and second electrical contacts are closed, and
when the first and second electrical contacts are open the first controllable impedance circuit is at the second impedance.

10. The RF diverter assembly according to claim 9, wherein the second controllable impedance circuit comprises:
a switch having first and second electrical contacts, the second electrical contact coupled to the second node;
a first impedance producing element coupled between the first node and the second node; and
a second impedance producing element coupled between the first node and the first electrical contact;
wherein
the first and second controllable impedance circuits form a parallel resonate circuit at the frequency and having the first impedance when the first and second electrical contacts are closed, and
when the first and second electrical contacts are open the first controllable impedance circuit is at the second impedance.

11. The RF diverter assembly according to claim 10, wherein
the first impedance producing element of the first and second controllable impedance circuits is a capacitor; and
the second impedance producing element of the first and second controllable impedance circuits is an inductor when the first and second electrical contacts are closed.

12. The RF diverter assembly according to claim 1, wherein the frequency is from about one (1) MHz to about 200 MHz.

13. The RF diverter assembly according to claim 1, wherein a fourth RF port of the second hybrid coupler is adapted for coupling to a resistance load.

14. The RF diverter assembly according to claim 13, wherein the resistance load has a characteristic impedance of the RF ports.

15. The RF diverter assembly according to claim 14, wherein the characteristic impedance of the RF ports is fifty (50) ohms.

16. A plasma processing chamber, comprising:
a substrate support assembly that comprises a substrate supporting surface that at least partially defines a processing region of the plasma processing chamber;
first and second electrodes in the plasma processing chamber;
a radio frequency (RF) power source assembly comprising:
an RF generator, and
an RF diverter assembly having an RF input adapted for coupling to the RF generator and first and second RF outputs adapted for coupling to first and second impedance matching networks, respectively,
an output of the first impedance matching network is coupled to the first electrode,
an output of the second impedance matching network is coupled to the second electrode,
the RF diverter assembly comprising a first hybrid coupler having four RF ports,
a second hybrid coupler having four RF ports; wherein
- a first RF port of the first hybrid coupler is coupled to a first RF port of the second hybrid coupler,
- a second RF port of the first hybrid coupler is coupled to a second RF port of the second hybrid coupler;
- a third RF port of the first hybrid coupler is coupled to the RF input of the RF diverter assembly;
- a third RF port of the second hybrid coupler is coupled to the first RF output of the RF diverter assembly; and
- a fourth RF port of the first hybrid coupler is coupled to the second RF output of the RF diverter assembly.

17. The plasma processing chamber according to claim 16, wherein
- the third RF port of the first hybrid coupler is coupled to the third RF port of the second hybrid coupler when the first and second controllable impedance circuits are at the first impedance; and
- the third RF port of the first hybrid coupler is coupled to the fourth RF port of the first hybrid coupler when the first and second controllable impedance circuits are at the second impedance.

18. The plasma processing chamber according to claim 16, further comprising a plurality of RF diverters having inputs selectively coupled to the RF generator and outputs coupled to respective ones of a plurality of impedance matching networks.

19. The plasma processing chamber according to claim 18, wherein outputs of the plurality of impedance matching networks are coupled to respective ones of a plurality of electrodes in the plasma processing chamber.

* * * * *